United States Patent
Yaginuma et al.

[11] Patent Number: 6,110,571
[45] Date of Patent: *Aug. 29, 2000

[54] DUPLEX COATED STEEL COMPOSITE PRODUCTS AND METHOD OF MANUFACTURING THEM

[75] Inventors: Yoshikazu Yaginuma, Hoya; Yoshiro Ishii, Nagareyama; Shinichi Okabe, Ichikawa, all of Japan

[73] Assignees: Sumitomo Metal Mining Co., Ltd.; Research Institute for Metal Surface of High Performance, Ltd., both of Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/881,376

[22] Filed: Jun. 24, 1997

Related U.S. Application Data

[63] Continuation of application No. 08/503,534, Jul. 18, 1995, abandoned.

[30] Foreign Application Priority Data

Jul. 19, 1994 [JP] Japan ................................. 6-188914
Apr. 24, 1995 [JP] Japan ................................. 7-123246

[51] Int. Cl.$^7$ ........................................................ B32B 9/00
[52] U.S. Cl. ........................ 428/216; 428/336; 428/472; 428/697; 428/698; 428/699
[58] Field of Search .................................. 428/698, 469, 428/472, 697, 699, 216, 336

[56] References Cited

U.S. PATENT DOCUMENTS

| | | | |
|---|---|---|---|
| 4,540,596 | 9/1985 | Nimmayadda | 427/37 |
| 4,753,854 | 6/1988 | Yavilov et al. | 428/698 |
| 4,842,710 | 6/1989 | Feller et al. | 204/192.38 |
| 5,330,853 | 7/1994 | Hofmann et al. | 428/697 |

OTHER PUBLICATIONS

Wolf–Dieter Münz, "Titanium Aluminum Nitride Films: A New Alternative to Tin Coatings" in J.Vac.Sci.Technol. A4(6), Nov./Dec. 1986, pp. 2717–2725.

*Primary Examiner*—Archene Turner
*Attorney, Agent, or Firm*—Watson Cole Grindle Watson, P.L.L.C.

[57] ABSTRACT

Duplex coated steel composite products comprising a first layer of a nitrided layer formed by applying glow discharge at a current density from 0.001 to 2.0 mA/cm$^2$ to the surface of metal parts by using gaseous ammonia and gaseous hydrogen while maintaining the temperature of the metal parts at 300 to 650° C., thereby applying plasma nitriding and a second layer comprising a hard film comprising a nitride, carbide and/or carbonitride of one or more of elements selected from Ti, Zr, Hf, V, Nb, Ta and Cr coated on the first layer by the PVD method of a laminate film or a gradient laminate film of such hard film. The treated products are excellent in adhesion with the substrate and durability and have both oxidation resistance and wear resistance.

6 Claims, 1 Drawing Sheet

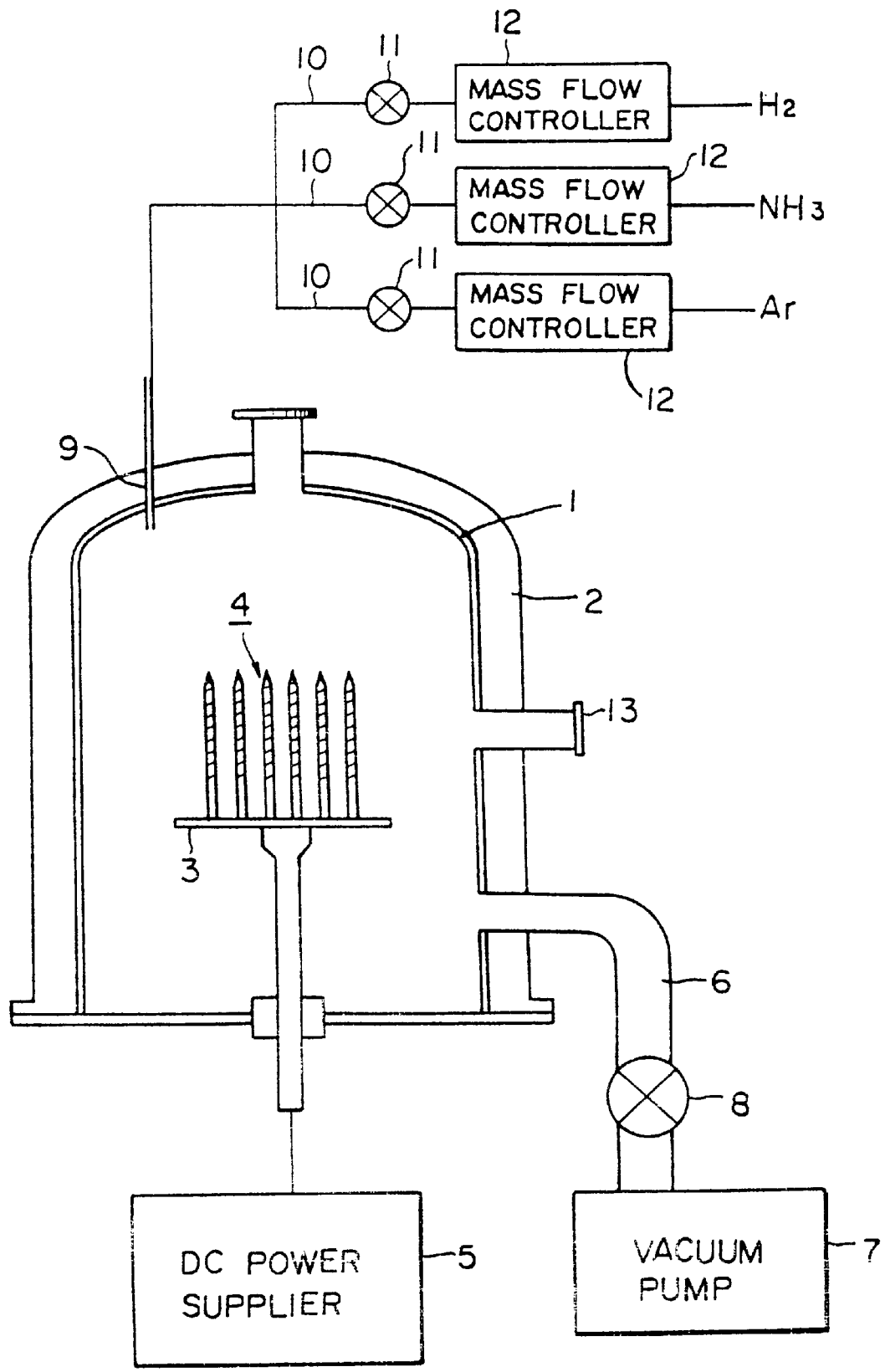

DUPLEX COATED STEEL COMPOSITE PRODUCTS AND METHOD OF MANUFACTURING THEM

CROSS-REFERENCE TO RELATED APPLICATION

This application is a continuation of application Ser. No. 08/503,534, filed Jul. 18, 1995, now abandoned.

FIELD OF THE INVENTION

The present invention concerns a technique of plasma nitriding for pretreatment of steel parts to be coated with a hard film, followed by formation of a hard film on the parts by a PVD method and, more in particular, it relates to a duplex coated steel composite product, the hard coating film of which is hardly broken and which is particularly excellent in wear resistance and oxidation resistance, as well as a method of manufacturing them.

BACKGROUND OF THE INVENTION

Formation of a hard film by a PVD method is advantageous in that the film can be formed at a relatively low temperature. As the pretreatment for forming a hard film on steel parts to be coated with the hard film, composite treatment generally conducted so far comprises previously subjecting the surface of the parts to plasma nitriding to thereby form a nitrided layer on the surfaces, and then forming a hard film on the nitrided layer whereby adhesion and durability of the thus-formed hard film is improved.

According to the existent plasma nitriding, it is possible to uniformly treat the surface of metal parts having relatively simple shapes and having no small unevenness to thereby form a nitrided layer thereon. It is also possible to form a thin hard layer having a thickness of from 5 to 15 μm or so on the surface of metal parts almost without enlarging the surface roughness of the parts.

It is well known to coat the surface of steel materials such as tools and molds with a film of TiN by a PVD method used for ion-plating, thereby improving the wear resistance of the materials. However, metal nitrides such as TiN are defective in that they are easily oxidized at high temperatures and their wear resistance is remarkably lowered owing to the brittle oxide layer formed by oxidation. Therefore, no sufficient effects have been obtained in tools for working hard steel materials or hardly cuttable materials and molds for hot working.

A TiAlN film has been proposed for the improvement of the oxidation problem of TiN. For instance, W. D. Muntz, et al of Reiboltherens Co. reported that TiAlN has good oxidation resistance (refer to J. Vac Sci. Technol., A4, 2717 (1986)).

The above mentioned TiAlN film has improved resistance due to addition of Al, but has a problem in that the mechanical characteristics of the film are worsened as the amount of al increases. Therefore, when the film is applied to tools, it worsens the quality of them. Since Al is added essentially as a sort of defects in the TiN film, the TiAlN film suffers from lowering of the toughness and has poor mechanical characteristic compared with TiN.

Worsening of the mechanical characteristics caused by the addition of Al becomes conspicuous in a region in which the amount of Al in the TiAlN film exceeds 10 mol % on the basis of metal ingredients. A TiAlN film with an amount of Al of less than 10% exhibits a mechanical characteristic similar with that of a TiN film, but no substantial effect can be obtained for oxidation resistance by the addition of Al at such a low concentration. For compensating the phenomena conflicting to each other, i.e., worsening of the mechanical characteristic and improvement of the oxidation resistance due to the addition of Al, a film of a structure in which an Al concentration changes continuously has been proposed. For instance, Japanese Patent Laid-Open Hei 2-170965 proposes a film structure having gradient Al concentration, in which the al concentration increases toward the surface and reaches the maximum Al concentration at the uppermost surface.

In the plasma nitriding of the prior art, if metal parts having fine slits, apertures or grooves, or metal parts of different shapes are subjected to plasma nitriding simultaneously, since plasma are localized to specified portions of the metal member, to make the distribution of plasma not uniform, plasma nitriding is not applied uniformly on the surface of the metal parts, or local overheating occurs to abnormally raise the temperature on the surface of the metal parts, thereby deteriorating the characteristic of the parts. Accordingly, it is impossible to apply uniform nitriding to the surface of the metal parts and, even if a hard film is formed by a PVD method on the metal parts that were subjected to not uniform nitriding, adhesion or durability of the film varies greatly.

Further, for improving the adhesion or durability of the film obtained by forming a nitrided layer (diffusion layer) by conducting plasma nitriding, it is necessary to form a nitrided layer of about 30 to 500 μm on the metal parts. However, when a nitrided layer (diffusion layer) of about 30 to 500 μm thickness is formed to the metal parts by the existent plasma nitriding of the prior art, the surface roughness of the metal parts is increased by sputtering, fine powder caused by sputtering or the like is deposited, or a brittle compound layer is formed. Then, when the film is formed over them, adhesion of the film is deteriorated and the adhesion or durability of the hard film formed after the plasma nitriding can not be improved but, rather, the characteristics of the hard film are worsened.

OBJECT AND SUMMARY OF THE INVENTION

In view of the foregoing problem, it is an object of the present invention to provide duplex coated steel composite products by uniformly applying plasma nitriding on the entire surface of metal parts of different shapes simultaneously or while keeping the surface state of the metal parts, and subsequently forming a hard film continuously by a PVD method in an identical or separate apparatus, thereby forming a hard film having high adhesion and durability on the surface of the metal parts, as well as a method of manufacturing such duplex coated steel composite products.

Further, in view of the fact that a TiAlN film is excellent in oxidation resistance compared with a TiN film but can provide no practical effect when it is applied to a working tool, etc. because of poor toughness, it is another object of the present invention to provide duplex coated steel composite products having both oxidation resistance and wear resistance and excellent in adhesion with a substrate and durability, by applying plasma nitriding on the entire surface of metal parts of different shapes simultaneously or while keeping the surface state of the metal parts, and subsequently forming a hard film continuously by a PVD method in an identical or separate apparatus as well as a method of manufacturing such duplex coated steel composite products.

A first feature of the present invention resides in a method of manufacturing duplex coated steel composite products which comprises applying glow discharge at a current density from 0.001 to 2.0 mA/cm$^2$ to the surface of metal parts by using gaseous ammonia and gaseous hydrogen while maintaining the temperature of the metal parts at 300 to 650° C., thereby applying plasma nitriding to forming a nitrided layer and forming, on the nitrided layer, a hard film comprising a nitride, carbide and/or carbonitride of one or more of elements selected from Ti, Zr, Hf, V, Nb, Ti and Cr by a PVD process or a laminate film or a gradient laminate film thereof of such hard film.

Another feature of the present invention resides in duplex coated steel composite products comprising a first layer of a nitrided layer formed by the plasma nitriding and a second layer of a hard film comprising a nitride, carbide and/or carbonitride of one or more of elements selected from Ti, Zr, Hf, V, Nb, Ta and Cr coated on the first layer by the PVD method or a laminate film or a gradient laminate film of such hard film.

A further object of the present invention resides in duplex coated steel composite products having oxidation resistance and wear resistance comprising a first layer of a nitrided layer formed by applying glow discharge at a current density from 0.001 to 2.0 mA/cm$^2$ to the surface of metal parts by using gaseous ammonia and gaseous hydrogen while maintaining the temperature of the metal parts at 300 to 650° C., thereby applying plasma nitriding to the surface of the metal parts, and a second layer formed by laminating a TiAlN film on the first layer by a PVD method.

A still further feature of the present invention resides in the duplex coated steel composite products, wherein the second layer comprises a laminate film in which the Al concentration in the TiAlN film changes continuously, a gradient film in which the Al concentration changes continuously or a laminate gradient film in which intermittent change and continuous change of the Al concentration are present together.

A still further object of the present invention resides in the duplex coated steel composite products wherein an intermediate layer comprising a nitride, carbide and/or carbonitride of one or more of elements selected from Ti, Zr, Hf, V, Nb, Ta and Cr is inserted between the TiAlN film and the metal parts in an amount of by less than 90% of the entire film thickness by a PVD method.

The steels to be treated in the present invention can include spring steels such as SUP 10, bearing steels such as SUJ 2, nitride steels such as SACM 645, hot working steels such as SKD 61, cold working steels such as SKD 11, high speed steels such as SKH 51, heat resistant steels such as SUS 301, machinery parts steel such as SCR 20 and heat resistant, acid resistant steels such as SUS 410.

Further, products to be treated in the present invention can include CD dies and various kinds of metal parts having relatively simple planar shapes, as well as screws for extrusion molding machines, screws for stirrers, molding dies for machinery parts, automobile gears, engine parts, various kinds of dices for aluminum extrusion, and cutting tools such as drills or end mills, having complicate shapes.

In the plasma nitriding for forming the nitrided layer as the first layer in the present invention, the temperature of the metal parts is defined as 300 to 650° C. by the following reasons.

Namely, it is necessary to heat the metal parts to a temperature of 300 to 650° C. in order to rapidly react the metal parts with nitrogen ions and heat them to such a reaction temperature as capable of conducting reaction at an economically acceptable yield. This is because the plasma nitriding reaction is extremely slow at a temperature lower than 300° C., whereas nitrides once formed are decomposed and no plasma nitriding occurs at a temperature higher than 650° C. Further, the parts to be treated can not be heated to and held at the above-mentioned predetermined temperature only by glow discharge at a current density of glow discharge of 0.001 to 2.0 mA/cm$^2$ used in the present invention and, accordingly, a heating means is necessary. Electric heating, gas heating or the like can be mentioned as the heating means, with the electric heating being easily usable. When a heating source is disposed at the inside or the outer side of a vacuum chamber for conducting the plasma nitriding, programmed temperature elevation or temperature maintenance can be attained easily in combination with an automatic control system.

As the gas used for the plasma nitriding, gaseous ammonia gas (NH$_3$) and gaseous hydrogen (H$_2$) are used, because gaseous ammonia is decomposed into N and H which are directly converted into N$_2$ and H$_2$ causing no sufficient plasma nitriding reaction, if plasma current density is high. However, gaseous ammonia is stable as ammonia radicals in a low plasma current density range, while gaseous hydrogen functions as an auxiliary gas for stably conducting radicalization of gaseous ammonia by electric discharge. A preferred NH$_3$/H$_2$ volume ratio is from 1/100 to 1/0 and, suitably, 1/10 to 3/1. If NH$_3$/H$_2$ volume ratio is less than 1/100, no sufficient plasma nitriding reaction occurs. In a case of not supplying gaseous hydrogen, since H$_2$ is generated as the auxiliary gas by decomposition of NH$_3$, the decomposed H$_2$ is used. For stabilizing plasma, Ar gas or the like may also be added.

In the present invention, the plasma-forming current applied to the surface of the metal parts is defined as 0.001 to 2.0 mA/cm$^2$, because the glow discharge can be used exclusively for converting gaseous ammonia and gaseous hydrogen into plasma and generate no excess heat only within the above-mentioned range of the current density. If the current density is less than 0.001 mA/cm$^2$, no sufficient plasma-formation can be obtained. On the other hand, if the current density exceeds 2.0 mA/cm$^2$, a local overheating is caused at the surface of the metal parts, failing to attain effective plasma nitriding in the slits or in the grooves. A current density within a range from 0.001 to 0.5 mA/cm$^2$ is particularly preferred in order to apply plasma nitriding treatment to gloss-polished metal parts, while maintaining the surface state as it is.

The thickness of the nitrided layer formed as the first layer (diffusion layer) is properly selected within a range from 5 to 500 μm and, preferably, from 20 to 200 μm depending on the film structure of the hard film formed as the second layer. If the thickness of the nitrided layer (diffusion layer) is less than 5 μm, adhesion of the hard film formed as the second layer can not be improved. On the other hand, if the thickness exceeds 500 μm, the parts themselves become brittle to have poor impact resistance durability.

Glow discharge for forming plasma may be either DC discharge or RF discharge. There is no particular restriction on a vacuum chamber for conducting plasma nitriding providing that the chamber basically comprises a glow discharging electrode and pipeline for plasma-forming gases and has an exhaust pipe connected with a vacuum pump.

In the present invention, the PVD method is adopted for forming the hard film, because a nitrided layer formed by plasma nitriding is lost by diffusion in a method of forming the film at a high temperature such as a thermal CVD method. Since the PVD method can form a film at a temperature lower than 650° C., it gives no undesired effects on a nitrided layer formed by the plasma nitriding.

The PVD method includes, for example, ion plating and sputtering and use of the ion plating method is desirable since a film having strong adhesion effective to the improvement of sliding wear resistance can be formed without losing the surface hard layer of the nitrided layer by heating upon film formation.

The ion plating method is generally adapted to vaporize a metal, ionize the vaporized metal and, further, accelerate ionized metal molecules by an electric field in a reactive gas atmosphere and deposit to settle them on the surface of a substrate. As a metal source in a case of forming a film such as a TiAlN film comprising a mixture of two or more metals, vaporization sources for respective metals have to be used, but a Ti-Al alloy may be used for instance in a case of forming a TiAlN film instead of using each of the metals. Vapors for respective metals are supplied at an aimed ratio by using the vaporization source(s) of pure metals or an alloy of different composition alone or in plurality at the same time.

As a means for vaporizating the metal, any of ohmic heating method or electron gun heating provided in existent ion plating apparatuses may be used. Further, the vaporizated metal can be ionized by any of known means such as cathode arc discharge, glow discharge, RF discharge, a method of using ionizing electrode and hollow cathode method. Among them, the cathode arc discharge type ion plating, which is a method of vaporizating and ionizing metal simultaneously, has high metal ionizing efficiency compared with other methods and is suitable to the formation of a film having high adhesion.

Further, when heating by ion bombandment is used upon heating a substrate prior to the formation of the film, heating is conducted by metal ions. An electric field for accelerating ionized metal ions is, preferably, at a voltage from −500 V to −2000 V and, more preferably, from −800 V to −1500 V.

For preparing a hard film, one or more of metals selected from Ti, Zr, Hf, V, Nb, Ta and Cr is used as the vaporizing source, and $N_2$, $NH_3$, hydrocarbons or nitrogen-containing organic compounds, for example, $(CH_3)_3N$ can be used as a reactive gas. The pressure of the reactive gas, although different depending on the kinds of the gas used, may properly be selected within a range from $10^{-3}$ to $10^1$ Torr.

The voltage for accelerating the ionized metal upon forming the hard film is preferably from −0 V to −700 V, further, preferably, from −50 V to −500 V.

The hard film, in this invention is a ceramic film and since it has a high Vickers hardness from 1500 to 3000 material and shows low friction coefficient compared with existent metal, it can provide excellent wear resistance. However, if the thickness is increased to greater than 10 um, brittleness inherent to ceramics develops to cause cracking or chipping, so that the thickness of the hard film is preferably less than 10 μm. On the other hand, if the thickness of the hard film is less than 1 μm, no sufficient characteristic van be obtained as the hard film. Therefore, the thickness of the hard film is preferably from 1 to 4 μm and, usually, about 3 μm.

TiN is a material having a B1 type crystal structure. In TiAlN as a substituted type solid solution in which a portion of Ti in TiN is substituted with Al, the material has the same B1 type structure as TiN within the amount of Al up to 70 mol % based on the metal ingredients of the TiAlN film. If Al concentration exceeds 70%, the crystal structure changes and the mechanical property of the film is undesirably reduced extremely.

A dense oxide layer is formed on the surface of the TiAlN film with solid-solubilized Al when the film is exposed to an oxidative atmosphere, to serve as a protection layer. Therefore, it has a function of preventing the film from oxidative degradation due to heat generated by abrasion, for example, in a cutting tool. Since the performance is greater as the Al concentration is higher, it is preferred that the Al concentration is at least greater than 20% in order to provide a sufficient oxidation resistance.

Since Al is present as a sort of defects in the TiAlN film, the film is poor in the toughness compared with TiN. Accordingly, when the substrate undergoes elastic deformation and plastic deformation, the TiAlN film can not follow the deformation and undergoes destruction. In the present invention, however, the elastic deformation or plastic deformation in the substrate less occurs due to the provision of the nitrided layer (diffusion layer) disposed as the first layer and, further, the toughness of the film is improved compared with TiAlN single layer film by changing the Al concentration in the TiAlN film intermittently and/or continuously and, as a result, destruction described above can be suppressed. Further, the toughness of the entire film is improved by interposing an intermediate layer having more excellent toughness than the TiAlN film comprising a nitride, carbide and/or carbonitride of one or more of metals selected from Ti, Zr, Hf, V, Nb, Ta and Cr between a first layer of the nitrided layer (diffusion layer) and the TiAlN film by an amount of less than 90% of the entire film thickness by the same PVD method as for the TiAlN film, to suppress the destruction described above. An intermediate layer formed to a thickness greater than 90% of the entire film thickness is not preferred since the thickness of the TiAlN film is reduced and no sufficient oxidation resistance can be obtained.

Since the elastic deformation or plastic deformation on the surface of the substrate is substantially suppressed by a duplex coating of disposing the nitrided layer as the first layer on the surface of the substrate on which a hard film is formed as the second layer, destruction of the hard film due to incapability of following after the elastic deformation and plastic deformation can be prevented, to improve the durability such as wear resistance of the film.

DESCRIPTION OF THE ACCOMPANYING FIGURE

The FIGURE is a schematic view illustrating the entire construction of a plasma nitriding apparatus for practicing the present invention.

DESCRIPTION OF THE PREFERRED EMBODIMENTS OF THE INVENTION

EXAMPLE

The FIGURE is a schematic view of a plasma nitriding device for practicing the present invention, in which is shown a vacuum chamber 1, heating heater 2, DC electrode 3, metal parts (drills) 4, DC power supplier 5, exhaust pipe 6, vacuum pump 7, valve 8, nozzle 9, introduction pipes 10, valves 11, mass flow controllers 10 and window 13.

The heating heater 2 is buried to the outer circumferential wall and the DC electrode 3 connected with the DC power supplier 5 is disposed to the inside of the vacuum chamber 1. The exhaust pipe 6 is connected from the lower portion of the vacuum chamber by way of the pressure control valve 8 to the vacuum pump 7. Starting material gases such as $H_2$ gas, $NH_3$ gas and Ar gas are supplied by way of the mass flow controllers 12, valves 11 and the introduction pipes 10, respectively, from the nozzle 9 to the inside of the vacuum chamber 1. The window 13 is disposed for observing plasma emission near the surface of the metal parts 4. The metal parts 4 are placed on the upper surface of the DC electrode 3.

The ion nitriding treatment and the film-forming treatment by the PVD method for practicing the invention can be conducted by using respective apparatuses. The plasma nitriding treatment can be conducted by using the above-mentioned apparatus but, depending on the case, a apparatus comprising the plasma nitriding apparatus and the PVD apparatus integrated together may also be used. For instance in a case of using a cathode arc type ion plating as the PVD method, an arc vaporizing source is disposed to the vacuum chamber 1 of the plasma nitriding apparatus. In such an integrated type apparatus, an inner heating furnace system of disposing a heating heater to the inner circumferential wall of the vacuum chamber 1 is more preferred to a structure of burying the heating heater 2 to the outer circumferential wall of the vacuum chamber 1 as in the plasma nitriding apparatus described above.

Example 1

After cleaning drills of SKH51 high speed steel (Vickers hardness Hv=850) with ultrasonic waves in ethanol, they were placed on the DC electrode 3 of the plasma nitriding apparatus shown in FIG. 1 and subjected to plasma nitriding. Plasma nitriding operation was conducted by placing the drills, evacuating the inside of the vacuum chamber 1 to $1 \times 10^{-3}$ Torr by the vacuum pump 7, supplying a hydrogen gas at 1000 ml/min while continuing evacuation, maintaining the pressure at 1 Torr and, at the same time, heating the surface of the drills by the heating heater 2, till the surface was heated uniformly to 500° C. Then, a voltage at −400 V was applied from the DC power supplier 5 to cause DC glow discharge plasma by a hydrogen gas and the surface of the drills 4 was cleaned for 30 min.

Successively, a hydrogen gas and an ammonia gas were introduced each at 2000 ml/min and 500 ml/min into the vacuum chamber 1, the pressure was maintained at 1.0 Torr, DC plasma of the hydrogen gas and the ammonia gas were generated under the application voltage of −500 V and plasma nitriding treatment was conducted for 30 min. Meanwhile, the density of current flowing to the drills was maintained to less than 0.2 mA/cm² and the plasma was controlled so as to be generated uniformly on the drill surface. The thickness of the hard layer of the drill after the treatment was 50 μm. Further, change of the surface roughness (Ra) was not observed before and after the treatment.

After the plasma nitriding treatment, the drills subjected to the nitriding treatment were placed in a cathode arc type ion plating apparatus having a Ti cathode, the inside of the reaction chamber was evacuated to $10^{-5}$ Torr, then a bias voltage at −1000 V was applied to the drills, and arc discharge was generated by the Ti cathode. The arc discharging current in this instance was 70 A. Then, while monitoring the surface temperature of the drills by an IR emission thermometer, arc discharge was continued for 2 min and Ti was vaporized and ionized to conduct sputter cleaning for the surface of the drills. Elevation of the temperature up to maximum temperature of 450° C. at the surface of the drills was observed during arc discharge.

Successively, application of the voltage to the Ti cathode was interrupted, a nitrogen gas was introduced into the reaction chamber, a bias voltage at −400 V was applied to the drills while causing the nitrogen gas to flow so as to keep the pressure in the chamber at $3 \times 10^{-3}$ Torr and arc discharge was generated from the Ti cathode. The arc discharging current in this instance was 90 A. As a result of continuous arc discharge for one hour, a hard TiN film layer was formed on the nitrided layer. The thickness of the TiN film was about 3 to 4 μm.

The Vickers hardness at the surface of the SKH 51 drills subjected to the treatment described above was measured. As a result, the Vickers hardness of prior art products not subjected to the plasma nitriding was 1600 Hv (100 g), whereas increase of the hardness to 1850 Hv (100 g) was confirmed for the products according to the present invention subjected to plasma nitriding as a pretreatment and it was recognized that occurrence of deformation was less caused on the surface of the drills.

Further, as a result of a scratch test for measuring a critical load value relative to the adhesion and the durability of the TiN film, the value was 47 Newton (N) for the products of the prior art not subjected to plasma nitriding, whereas the products of the present invention showed a high value of 53 Newton (N), and it was recognized that the adhesion and the endurance of the thus formed TiN film were improved.

Further, as a result of a cutting test for the drills under the following conditions, it was observed that in the products according to the present invention subjected to the plasma nitriding, the number of apertures that could be cut (cutting performance) was increased by about 4 to 6 times compared with the products of the prior art without nitriding.

(Conditions for Cutting Test)

Material to be cut: SCM 440

Drill rotational speed: 1500 rpm

Feeding rate: 0.15 mm/rev.

Cutting depth: 20 mm

Comparative Example 1

A cutting test was conducted under the same conditions as those in Example 1 on drills obtained by nitriding by an existent ion nitriding method at 430° C. for 15 min of heating parts to be treated and causing nitriding reaction by using a plasma nitriding apparatus in which a vacuum chamber was cooled and using DC plasma of $N_2$ and $H_2$, and forming a TiN film by the same ion plating method as in Example 1. As a result, although the cutting performance was improved compared with products of the prior art not subjected to nitriding, the improvement was only about twice at the greatest.

Example 2

Plasma nitriding was conducted in the same manner as in Example 1 for 30 min using drills made of SKH 51 high speed tool steels. The depth of the hardened layer was about 50 μm. The drills were placed in a cathode arc type ion plating apparatus provided with a Ti cathode and, after evacuating the inside of the reaction chamber to $10^{-5}$ Torr, a bias voltage at −1000 V was applied to the drills and arc discharge was generated by the Ti cathode. The arc discharging current was 70 A. Then, arc discharging was continued for 2 min while monitoring the temperature at the surface of the substrate by IR emission thermometer, Ti was vaporized and ionized to conduct sputter cleaning for the surface of the drills. Elevation of the temperature up to the maximum 450° C. at the surface of the drills was recognized during arc discharge.

Successively, application of the voltage to the Ti cathode was interrupted, and a bias voltage at −400 V was applied to the drills while causing a gas mixture of a nitrogen gas, an acetylene gas and argon gas to flow in the reaction chamber and arc discharge was generated from the Ti cathode. The arc discharging current was 90 A. As a result of continuous arc discharge for one hour, a hard coating layer of TiCN film was formed on the nitrided layer. The thickness of the TiCN film was about 3 to 4 μm.

As a result of conducting a cutting test under the same conditions as those Example 1 for the drills subjected to the treatment described above, it was recognized also in the products according to the present invention that the cutting performance was improved by about 4 to 6 times compared with products of the prior art without nitriding.

Example 3

After cleaning a drills (ø6 mm) of SKH51 high speed steel (Vickers hardness: HV=805) with ultrasonic waves in an organic solvent, they were placed in an external heating furnace type plasma nitriding apparatus and subjected to plasma nitriding. The inside of the vacuum chamber 1 was evacuated to $1 \times 10^{-3}$ Torr by the vacuum pump 7, a hydrogen gas was supplied at 1000 ml/min while continuing evacuation, to maintain the pressure at 1 Torr and, at the same time, the drills were heated by the heating heater 2 till the surface was heated uniformly to 500° C. Then, a voltage at −400 V was applied from the DC power supplier to cause DC glow discharge plasma by the hydrogen gas and the surface of the drills 4 was cleaned for 30 min. Successively, a hydrogen gas and an ammonia gas were introduced each at 2000 ml/min and 500 ml/min, respectively, into the vacuum chamber 1, the pressure was maintained at 1.0 Torr, DC plasma of the hydrogen gas and the ammonia gas were generated under the application of a voltage at −500 V and plasma nitriding treatment was conducted for 60 min. Meanwhile, the density of the current flowing to the drills was maintained to less than 0.2 mA/cm$^2$ and the plasma was controlled so as to be generated uniformly on the drill surface. The thickness of the hard layer of the drill after the treatment was 100 μm. Further, the surface roughness (Ra) was 0.02 μm, which showed no change before and after the treatment.

After the plasma nitriding treatment, the drills subjected to the nitriding treatment were placed in a cathode arc type ion plating apparatus having a Ti-Al target with an Al tion of 60 mol % and a Ti target, the inside of the reaction chamber was evacuated to $10^{-5}$ Torr, then a bias voltage at −1000 V was applied to the drills, and arc discharge was generated by the Ti cathode. The arc discharging current in this instance was 90 A. Then, while monitoring the surface temperature of the drills by an IR emission thermometer, arc discharge was continued for 2 min and Ti was vaporized and ionized to conduct sputter cleaning for the surface of the drills. Elevation of the temperature up to the maximum temperature of 450° C. at the surface of the drills was observed during arc discharge.

Successively, application of the voltage to the Ti cathode was interrupted, a nitrogen gas was introduced into the reaction chamber, a bias voltage at −400 V was applied to the drills while causing the nitrogen gas to flow so as to keep the pressure in the chamber at $3 \times 10^{-3}$ Torr and arc discharge was generated from the Ti cathode. The arc discharging current in this instance was 90 A. As a result of continuous arc discharge for one hour, a hard layer of TiAlN film (second layer) was formed on the nitrided layer (first layer).

As a result of measuring the thickness of the resultant film by a ball crater method, it was 2.8 μm. As a result of measuring the surface hardness by a Vickers hardness gage under 25 g load, the hardness was Hv 2430.

Further, as a result of a scratch test, a critical load value (Lc value) was 45 N. The Al concentration in the film was 55.2% as a result of measuring by an electron ray microanalyzer (EPMA).

Further, a cutting test was conducted to the drills using SCM 440 as a work to be cut, and under the conditions at a rotational speed of 1500 rpm, at a feed rate of 0.15 mm/rev. and with a cutting depth of 20 mm. As a result, cutting was possible for 460 apertures.

Example 4

After conducting plasma nitriding for 30 min in the same procedures as in Example 3 and conducting sputter cleaning in the same manner as in Example 3, a nitrogen gas was at first introduced into the reaction chamber, a bias voltage at −400 V was applied to drills while causing a nitrogen gas to flow such that the pressure in the chamber was kept at $3 \times 10^{-2}$ Torr, and arc discharge was generated from the Ti cathode to form a Ti film. The arc discharge was continued for 30 min. Then, application of the voltage to the Ti cathode was interrupted, a bias voltage at −500 V was applied successively to the drills, and arc discharge was generated from the Ti-Al cathode to form a TiAlN film. The arc discharging current was 90 A. The arc discharge was continued for 30 min.

The thickness of the formed nitrided layer (diffusion layer) was 50 μm. The entire thickness of the resultant film was 3 μm and the thickness for each of the layers was 1.5 μm. The surface hardness was Hv 2390 and the Lc value was 54 N. The Al concentration at the surface of the film was 54.1%. Further, as a result of the same cutting test in Example 3, cutting was possible for 520 apertures.

Example 5

Plasma nitriding was conducted in the same manner as in Example 3, and arc discharge was generated from the Ti cathode in the same manner as in Example 3 while disposing the drills in a cathode arc type ion plating apparatus having a Ti target and an Al target. After sputter-cleaning the surface of the drills, the application of the voltage to the Ti cathode was interrupted, nitrogen gas was introduced in the reaction chamber, a bias voltage at −500 V was applied to the drills while causing the nitrogen gas to flow so as to keep the pressure in the chamber at $3 \times 10^{-2}$ Torr and arc discharge was generated at an arc discharging current of the Ti cathode at 60 A and an arc discharging current of the Al cathode of 40 A. Subsequently, the arc discharging current in total for both of the cathodes was maintained at 100 A, and arc discharging was continued for 60 min while decreasing the current continuously to 40 A in the Ti cathode and gradually increasing the current to 60 A continuously on the Al cathode.

The entire thickness of the resultant film was 3.5 μm. The surface hardness was Hv 2400, and the Lc value was 49 N. The Al concentration in the film was changed from about 34% to 58% in the direction from the drill to the surface of the film and provided a gradient structure in which the Al concentration was increased toward the surface of the film. Further, as a result of the identical cutting test with Example 3, cutting was possible for 490 apertures.

Example 6

Plasma nitriding was conducted by the same method as in Example 3, and after placing drills in a cathode arc type ion plating apparatus having a TiAl target with a Al concentration of 70 mol % and a Ti target and generating arc discharge from the Ti cathode and sputter cleaning the surface of the drills in the same manner as in Example 3, the voltage application to the Ti cathode was interrupted, a nitrogen gas was introduced in the reaction chamber, a bias voltage at −500 V was applied to the drills while causing a nitrogen gas to flow so as to keep the pressure in the chamber at $3 \times 10^{-2}$ Torr and a TiN film was formed for 10 min. Then, the application of the voltage to the Ti cathode was interrupted and, successively, a bias voltage at −500 V was applied to the drills, the arc discharge was generated from the Ti-Al cathode and a TiAlN film was formed for 10 min. Successively, a bias voltage at −500 V was applied to the drills and arc discharge was generated at an arc discharging current of 60 a on the Ti cathode and at an arc discharging current of 40 A on the TiAl cathode. Then, the total arc discharging current for both of the cathodes was maintained at 100 A in which the discharging current was gradually lowered to 40 A on the Ti cathode and gradually increased up to 60 A on the TiAl cathode to continue arc discharge for 30 min.

The entire thickness of the resultant film was 3 μm, and the thickness of the TiN film formed to the first layer was about 0.5 μm. The surface hardness HV was 2360 and Lc value was 52 N. The Al concentration in the film was about 66% near the TiAlN film formed to the second layer, and changed about from 25% to 67% in the successively formed TiAlN film in the direction of the drill as the substrate to the surface of the film, and the film had a composite gradient laminate structure including an intermittent Al concentration change and a continuous Al concentration change. Further, as a result of the identical cutting test with Example 3, cutting for 49 apertures was possible.

Example 7

Drills manufacture in Example 3 were subjected to a heat treatment in an atmospheric air at 50° C. for 2 hours. Subsequently, the same cutting test as in Example 3 was conducted and, as a result, cutting was possible for 420 apertures.

Comparative Example 2

The same treatment as in Example 3 was conducted except for not conducting the plasma nitriding. The thickness of the resultant film was 3 μm, the surface hardness Hv was 2270 and Lc value was 23 N. The Al concentration in the film was 55.7%. Further, as a result of the cutting test, the number of possible cutting was 18 apertures.

Comparative Example 3

The same treatment as in Example 4 was conducted except for not conducting plasma nitriding. The thickness of the resultant film was 3.2 μm, the surface hardness Hv w Hv 2210 and the Lc value was 32 N. The Al concentration in the film was 53.9%. Further, as a result of the cutting test, the number of possible cutting was 27 apertures.

Comparative Example 4

The same treatment as in Example 5 was conducted except for no conducting plasma nitridation. The thickness of the resultant film was 3.2 μm, the surface hardness Hv was 2180 and the Lc value was 25 N. The Al concentration in the film changed about from 32% to 58% in the direction from the drills as the substrate to the surface of the film and the film had a gradient structure. Further, as a result of the cutting test, the number of possible cutting was 23 apertures.

Comparative Example 5

The same treatment as in Example 6 was conducted except for not conducting plasma nitriding. The thickness of the resultant film was 3.2 μm, and the thickness of the TiN film formed to the first layer was 0.5 μm. The Al concentration in the film changed from about 32% to 58% in the direction from the drills as the substrate to the surface of the film and the film had a gradient structure. Further, as the result of the cutting test, the number of possible cutting was 28 apertures.

Comparative Example 6

A Ti film was formed in the same procedures as those in Example 4 using only the Ti target without plasma nitriding. As a result of a cutting test, the number of possible cutting was 300 apertures. The drill was subjected to the same heat treatment as in Example 7, and as a result of the same cutting test as in Example 3, the number of possible cutting was 8 apertures.

Comparative Example 7

The same procedures as those in Example 3 were conducted except for changing the plasma nitriding time to 48 hours. The thickness of the resultant nitrided layer (diffusion layer) was 700 μm, the thickness of the TiAlN film of the second layer was 2.9 μm, the surface hardness Hv was 2430, and the Lc value was 17 N. Further, chipping was observed for the drills after film formation and they were impossible to use.

Comparative Example 8

The same treatment as in Example 3 was conducted except for applying nitriding by the existent plasma nitriding method using DC plasma of $N_2$ and $H_2$. A voltage at −400 V was applied from a DC power source to drills as a substrate, while flowing a $H_2$ gas at 1000 ml/min and a $N_2$ gas at 1000 ml/min as the starting material gas, using a plasma nitriding apparatus having a structure of a water cooled reactor body and maintaining the pressure at 3 Torr, and the drills were subjected to nitriding for 60 min by heating up to 500° C. by the generated DC glow discharge plasma. Subsequently, a TiAlN film was formed in the same manner as in Example 3.

The thickness of the thus formed nitrided layer (diffusion layer) was 100 μm. Further, the entire thickness of the resultant film was 3 μm. The surface hardness Hv was 2450 and the Lc value was 28 N. The Al concentration on the surface of the film was 55.4%. As a result of the cutting test, the number of possible cutting was 28 apertures.

As has been described above, the present invention can provide the following advantageous effects.
(1) Deformation of the hard film is less caused and destruction of the hard film can be reduced by applying plasma nitriding as a pretreatment, compared with case of directly forming a hard film on metal parts.
(2) Since the plasma nitriding treatment according to the present invention can form a hard layer (diffusion layer) without increasing the surface roughness of metal parts, the hard film formed after the plasma nitriding has strong adhesion and durability.
(3) Since the PVD method can form a film at a relatively low temperature of lower than 650° C., a previously formed nitrided layer is not lost by the thermal diffusion of nitrogen.

(4) Among metal parts, since those having complicated shapes such as drills or those having a finely grooved structure at the surface can be subjected uniformly to the plasma nitriding, a hard film of excellent adhesion and durability can be formed over the entire metal parts.

(5) Since duplex coated steel composite products having oxidation resistance and wear resistance according to the present invention have a composite film comprising a first layer of a nitrided layer formed on the surface of metal parts and a second layer of a TiAlN film formed thereon, elastic deformation or plastic deformation occurs scarcely at the surface of the parts, so that destruction of the TiAlN film of poor toughness caused by the incapability of the film to follow the elastic deformation and the plastic deformation can be suppressed. As a result, the destruction of the TiAlN film can be reduced to provide excellent oxidation resistance and mechanical property.

(6) Further, according to the laminate gradient film in which the Al concentration in the TiAlN film as the second layer intermittently changes within a range from 20 to 70 mol % based on the metal ingredients in the TiAlN film of the second layer, or a gradient film in which the Al concentration changes continuously or a laminate gradient film in which the Al concentration changes intermittently and continuously together, the toughness is increased and the mechanical property and durability can be improved compared with the TiAlN single layer film.

(7) Further, when an intermediate layer of excellent toughness is disposed between the nitrided layer (diffusion layer) of the first layer and the TiAlN layer, the toughness of the entire film can be improved further and the mechanical property and the endurance.

What is claimed is:

1. A duplex coated steel composite product which comprises a steel substrate having a first diffusion layer formed of steel alloy with nitrogen atoms diffused therein, and a second layer located on said first diffusion layer, said second layer including at least one hard film selected from the group consisting of a hard film which contains at least one of a nitride, carbide or carbonitride of a metal selected from the group consisting of Ti, Zr, Hf, V, Nb, Ta and Cr, a laminate film and a gradient laminate film of said hard film.

2. A duplex coated steel composite product which comprises a steel substrate having a first diffusion layer formed of steel alloy with nitrogen atoms diffused therein, and a second layer located on said first diffusion layer, said second layer comprising a TiAlN film having an amount of Al of between 20 and 70 mol %.

3. Duplex coated steel composite products having oxidation resistance and wear resistance as defined in claim 2, wherein the TiAlN film of the second layer is a laminate film in which the Al concentration in the film changes intermittently, an ingredient film in which the Al concentration changes continuously, or a laminate gradient film in which the intermittent change and continuous change are present together.

4. Duplex coated steel composite products having oxidation resistance and wear resistance as defined in claim 3, wherein an intermediate layer comprising at least one compound selected from the group consisting of nitride, carbide and/or carbonitride of a metal selected from the group consisting of Ti, Zr, Hf, V, Nb, Ta and Cr by a PVD method is interposed between the TiAlN film and the metal parts by the PVD method in an amount of less than 90% of the entire film thickness.

5. Duplex coated steel composite products as defined in claim 2, wherein the first layer has a thickness from 5 to 500 μm.

6. Duplex coated steel composite products as defined in claim 2, wherein the second layer has a thickness from 1 to 10 μm.

* * * * *